United States Patent
Liu et al.

(10) Patent No.: US 12,289,979 B2
(45) Date of Patent: Apr. 29, 2025

(54) DEPOSITION SYSTEM FOR HIGH ACCURACY PATTERNING

(71) Applicant: Taiwan Semiconductor Manufacturing Company, Ltd., Hsin-Chu (TW)

(72) Inventors: Ping-Yin Liu, Yonghe (TW); Chia-Shiung Tsai, Hsin-Chu (TW); Xin-Hua Huang, Xihu Township (TW); Yu-Hsing Chang, Taipei (TW); Yeong-Jyh Lin, Caotun Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/361,008

(22) Filed: Jul. 28, 2023

(65) Prior Publication Data

US 2023/0371354 A1   Nov. 16, 2023

Related U.S. Application Data

(62) Division of application No. 16/806,064, filed on Mar. 2, 2020, now Pat. No. 11,818,944.

(51) Int. Cl.
*H10K 71/16* (2023.01)
*C23C 16/04* (2006.01)
(Continued)

(52) U.S. Cl.
CPC ......... *H10K 71/166* (2023.02); *C23C 16/042* (2013.01); *C23C 16/4584* (2013.01); *H10K 50/125* (2023.02); *H10K 71/00* (2023.02)

(58) Field of Classification Search
CPC ..... C23C 14/042; C23C 14/50; C23C 16/042; C23C 14/54; C23C 16/04; C23C 16/4583;
(Continued)

(56) References Cited

U.S. PATENT DOCUMENTS 9,847,485 B2   12/2017   Min
9,991,333 B1   6/2018   Liu et al.
(Continued)

FOREIGN PATENT DOCUMENTS

TW   201742292 A   12/2017

OTHER PUBLICATIONS

Freudenrich, Craig. "How OLEDs Work" The date of publication is unknown. Retrieved online on Aug. 6, 2019 from https://electronics.howstuffworks.com/oled.htm/printable.
(Continued)

*Primary Examiner* — Jaehwan Oh
(74) *Attorney, Agent, or Firm* — Eschweiler & Potashnik, LLC

(57) ABSTRACT

The present disclosure relates to a processing tool that includes a first wafer-mounting frame and a second wafer-mounting frame. The first wafer-mounting frame is configured to retain a target wafer. The second wafer-mounting frame is configured to retain a masking wafer. The masking wafer includes a mask pattern made up of a number of openings passing through the masking wafer to correspond to a predetermined deposition pattern to be formed on the target wafer. A deposition chamber is configured to receive the first and second wafer-mounting frames, when the first and second wafer-mounting frames are clamped together to retain the target wafer and the masking wafer. The deposition chamber includes a material deposition source configured to deposit material from the material deposition source through the number of openings in the mask pattern to form the material in the predetermined deposition pattern on the target wafer.

20 Claims, 13 Drawing Sheets

(51) Int. Cl.
*C23C 16/458* (2006.01)
*H10K 50/125* (2023.01)
*H10K 71/00* (2023.01)

(58) Field of Classification Search
CPC ... H01L 51/0011; H01L 21/682; H01L 21/32; H01L 21/681; H01L 21/6831
See application file for complete search history.

(56) References Cited

U.S. PATENT DOCUMENTS

| | | | | |
|---|---|---|---|---|
| 10,636,969 | B2* | 4/2020 | Donoghue | H10K 50/125 |
| 2003/0179354 | A1* | 9/2003 | Araki | G03F 7/70866 |
| | | | | 355/53 |
| 2005/0053720 | A1* | 3/2005 | Yamazaki | H10K 71/00 |
| | | | | 427/69 |
| 2006/0086321 | A1* | 4/2006 | Brody | C23C 14/042 |
| | | | | 118/728 |
| 2006/0148114 | A1* | 7/2006 | Yotsuya | H01L 21/6831 |
| | | | | 257/E21.232 |
| 2009/0208880 | A1 | 8/2009 | Nemani et al. | |
| 2011/0304418 | A1* | 12/2011 | Schuessler | G03F 7/707 |
| | | | | 335/289 |
| 2012/0056329 | A1 | 3/2012 | Pagaila et al. | |
| 2012/0204794 | A1* | 8/2012 | Ko | C23C 14/12 |
| | | | | 118/721 |
| 2013/0093049 | A1 | 4/2013 | Ananthan et al. | |
| 2015/0031148 | A1 | 1/2015 | De et al. | |
| 2015/0077733 | A1* | 3/2015 | Huang | C23C 16/34 |
| | | | | 355/72 |
| 2015/0114293 | A1* | 4/2015 | Chung | C23C 16/042 |
| | | | | 118/721 |
| 2016/0079532 | A1* | 3/2016 | Yi | C23C 14/042 |
| | | | | 438/758 |
| 2018/0315924 | A1 | 11/2018 | Anandan et al. | |
| 2018/0315926 | A1* | 11/2018 | Donoghue | H10K 71/191 |
| 2020/0340094 | A1* | 10/2020 | Itabashi | H01L 21/682 |
| 2021/0348265 | A1* | 11/2021 | Okamoto | C23C 14/54 |
| 2022/0189815 | A1* | 6/2022 | Riordon | H01L 21/6835 |

OTHER PUBLICATIONS

Non-Final Office Action dated Sep. 21, 2022 for U.S. Appl. No. 16/806,064.
Final Office Action dated Apr. 21, 2023 for U.S. Appl. No. 16/806,064.
Notice of Allowance Jul. 14, 2023 for U.S. Appl. No. 16/806,064.

* cited by examiner

DEPOSITION SYSTEM FOR HIGH ACCURACY PATTERNING

REFERENCE TO RELATED APPLICATION

This application is a Divisional of U.S. application Ser. No. 16/806,064, Mar. 2, 2020, the contents of which are hereby incorporated by reference in their entirety.

BACKGROUND

An organic light emitting diode (OLED) is a light-emitting diode that includes an emissive electroluminescent layer comprising an organic compound that emits light in response to an electric current. Thus, when a current is passed through the OLED, the emissive layer emits light.

An array of such OLEDs can be formed with different organic compounds at different respective positions in the array to generate different colors (e.g., red, blue, and green) at those respective positions. Thus, by providing suitable currents to the various OLEDs of the array, a digital image made up of the underlying regions of the different colors can be generated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
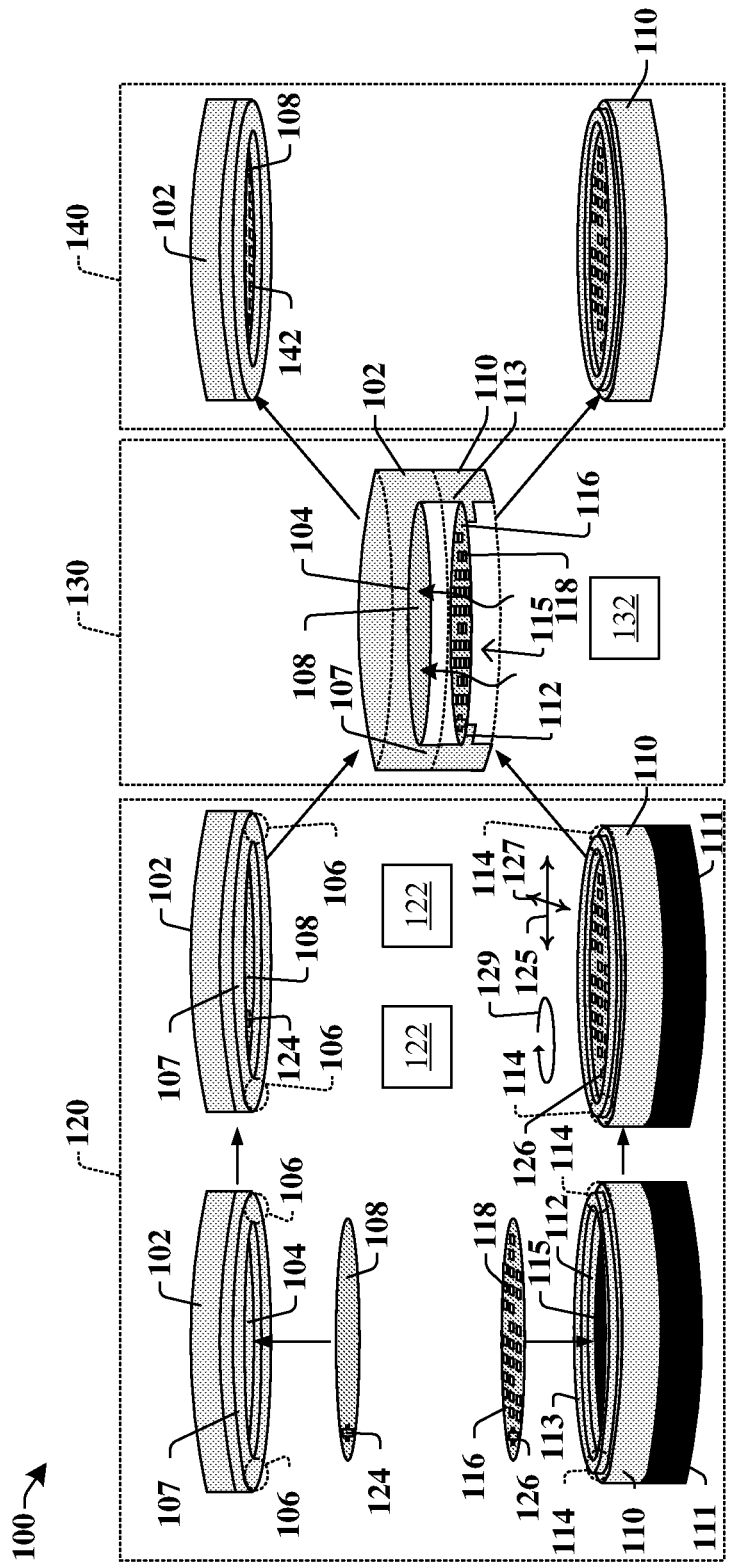
FIG. 1A shows a schematic view of some embodiments of a processing tool that is suited for manufacturing OLED devices with high accuracy patterning.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When a current is passed through an OLED, an emissive layer in the OLED emits light. Such emissive layers are typically made through a selective deposition process to form a pixel array on a wafer. For example, a first organic compound that generates blue light when biased by current is first deposited in a first pattern on the wafer, then a second organic compound that generates red light when biased by current is deposited in a second pattern on the wafer, and then a third organic compound that generates green light when biased by current is deposited in a third pattern on the wafer. The first, second, and third patterns can be arranged to establish a pixel array on the substrate and are often non-overlapping with one another. Further, the first, second and third patterns are arranged such that each pixel has a single subpixel region made of the first material (e.g., a blue subpixel), a single subpixel region made of the second material (e.g., a red subpixel), and a single subpixel region made of the third material (e.g., a green subpixel). These subpixels are separately addressable over the pixel array, such that each pixel of the pixel array can produce red, green, or blue light at a given time. Thus, when the pixels are all viewed together and their individual subpixels regions are biased appropriately, the resultant mosaic of red, blue, and/or green light from the pixels can display a digital image made up of those underlying colors. However, typical systems and methods of manufacturing these pixels do not provide optimal alignment accuracy for the individual subpixels. Accordingly, the present disclosure provides for improved systems and methods for performing selective depositions according to a predetermined pattern, such as in OLEDs among other devices. These improved systems and methods can enable OLED displays with higher pixels per square inch (PPI) than other approaches.

FIG. 1A illustrates some embodiments of a processing tool 100 that is suited for manufacturing OLED devices with high accuracy patterning, as well as other devices. The processing tool 100 includes a wafer chuck and alignment station 120, and a deposition chamber 130. Briefly, the processing tool 100 receives a target wafer 108 on which an OLED pixel array is to be formed, and also receives a masking wafer 116 with openings 118 passing through the masking wafer 116 to define a predetermined deposition pattern. After the target wafer 108 and the masking wafer 116 are chucked and aligned in 120, the masking wafer 116 is clamped over the target wafer 108 and emissive material is deposited through the openings 118 of the predetermined deposition pattern to form substantially the same predetermined deposition pattern on the target wafer 108 in the deposition chamber 130.

More particularly, the wafer chuck and alignment station 101 includes a first wafer-mounting frame 102 and a second wafer-mounting frame 110. The first wafer-mounting frame 102 includes a first engagement face 104 and a first coupling assembly 106, wherein the first engagement face 104 is configured to retain the target wafer 108. In some embodiments, the first wafer-mounting frame 102 includes a first retaining ring 107 which extends from the first engagement face and which laterally surrounds the target wafer 108 to help retain the target wafer. Thus, in some regards the first engagement face 104 and the first retaining ring 107 create a dome-like enclosure that entirely covers a top surface (e.g., backside) of the target wafer 108 when the target wafer is retained.

The second wafer-mounting frame 110 can rest on a base pedestal 111, and includes a second engagement face 112 and a second coupling assembly 114. The second wafer-mounting frame 110 is configured to retain the masking wafer 116 on the second engagement face 112. The second engagement face 112 can take the form of a ring-shaped ledge and supports an outer edge of the masking wafer 116 while leaving an opening 115 beneath a central region of the masking wafer 116. Thus, the ledge has an inner perimeter that is less than an outer perimeter of the masking wafer 116, such that a central region of the underside of the masking wafer 116 is uncovered. The inner perimeter of the ledge is often fairly close in size to the outer perimeter of the masking wafer—for example, the inner perimeter of the ledge can range between 50% and 98% of the outer perimeter of the masking wafer in some embodiments. A second retaining ring 113 may laterally surround the masking wafer 116 to help retain the masking wafer. The second coupling assembly 114 is configured to engage the first coupling assembly 106 to couple the first wafer-mounting frame 102 to the second wafer-mounting frame 110.

In some embodiments, the first coupling assembly 106 can be arranged on the first retaining ring 107, and can manifest as an electromagnet that can be selectively enabled/disabled. The second coupling assembly 114 can be arranged on the second retaining ring 113, and can manifest as a ferrous material or as an electromagnetic that selectively couples and decouples to/from the first coupling assembly 106. In other embodiments the first and second coupling assemblies 106, 114 can mechanically couple/decouple to/from one another, and can manifest as a clasp, a male-female connection, a friction-fit button or other friction-fit engagement assembly, or a ball that engages a slot, for example. The first and second coupling assemblies 106, 114 can also be coupled/decoupled by a trench or suction cups that enable a vacuum fit. Error position sensors can be included in the first wafer-mounting frame 102 and second wafer-mounting frame 110 to indicate whether the first and second coupling assemblies are correctly coupled to one another.

After the target wafer 108 and masking wafer 116 are retained in the first wafer-mounting frame 102 and second wafer-mounting frame 110, respectively, the first and second wafer-mounting frames 102, 110 are aligned with one another. Thus, the wafer chuck and alignment assembly 120 includes one or more imaging devices 122 configured to measure an amount of misalignment between a target alignment mark 124 on the target wafer 108 and a first alignment mark 126 on the first masking wafer 116. Then, at least one of the target wafer 108 and the first masking wafer 116 is moved, for example in an x-direction 125 in a plane parallel to the target wafer and/or masking wafer, y-direction 127 in the plane, and/or through an angular rotation 129 in the plane. This movement reduces the amount of misalignment, thereby aligning the first masking wafer 116 and the target wafer 108. The movement can be accomplished by rollers or actuators in the engagement faces of the first and second wafer-mounting frames that contact the target wafer and/or masking wafer, by rollers or actuators that move the first retaining ring and/or second retaining ring to "slide" the target wafer and/or masking wafer along the engagement surfaces, and/or can be accomplished by one or more robotic arm(s) that lifts and/or slides the target wafer and/or masking wafer along the engagement surfaces. Other mechanisms for movement are also contemplated as falling within the scope of this disclosure.

After the target wafer 108 and the first masking wafer 116 have been aligned, the first and second coupling assemblies 106, 114 are activated to clamp the first wafer-mounting frame 102 to the second wafer-mounting frame 110, and the clamped first and second wafer-mounting frames 102, 110 are removed from the base pedestal 111 and transferred into the deposition chamber 130. In this deposition chamber 130 (which is shown as a cross-sectional view in FIG. 1A), emissive material from a deposition source 132, which for example can include an organic material, is passed through the openings 118 in the masking wafer 116 to form the emissive material according to the predetermined deposition pattern on the target wafer 108. In some embodiments, the target wafer 108 and masking wafer 116 are spaced apart by a vertical space which helps in preventing contaminants on the masking wafer 116 from coming into contact with the target wafer. In some embodiments, the vertical space is less than 1 centimeter, though in some embodiments the vertical space can be less than 1 millimeter or even less than 1 micrometer to help provide more accurate patterning.

After the emissive material has been formed according to the predetermined deposition pattern 142 on the target wafer 108, the first wafer-mounting frame 102 is then unclamped from the second wafer-mounting frame 110 (see 140). Because the target wafer 108 and the masking wafer 116 are each aligned with one another according to their respective alignment marks prior to the deposition, the resultant emissive material formed in the predetermined deposition pattern 142 on the target wafer 108 is more precisely aligned than in previous techniques. For example, in some instances, the processing tool 100 can produce OLED displays with 3000 pixels per inch (PPI) with an alignment error of less than 0.5 micrometers that is well-suited for virtual reality (VR) and/or augmented reality (AR) applications, among others.

Figure 1B:
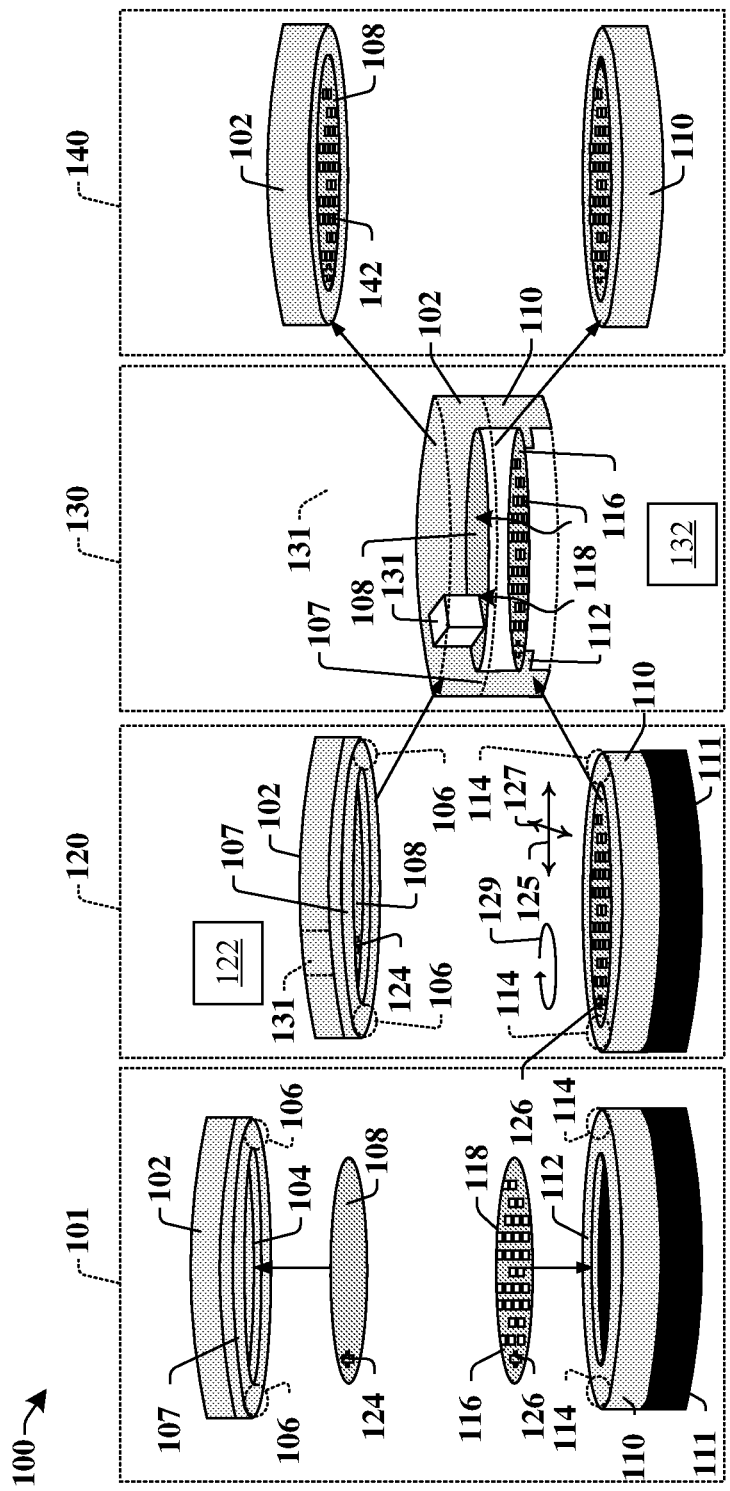
FIG. 1B shows a schematic view of some other embodiments of a processing tool that is suited for manufacturing OLED devices with high accuracy patterning.

FIG. 1B shows a schematic view of some embodiments of a processing tool that is suited for manufacturing OLED devices with high accuracy patterning. In FIG. 1B, the engagement surface of the first wafer-mounting frame includes a window 131, such as a glass or other transparent window, that allows viewing of the target alignment mark 124 on the target wafer 108. For example, the target alignment mark 124 may be made of a metal, such as chrome, nickel, titanium, or aluminum and can be on the frontside of the target wafer 108. In cases where the viewing is done with ultraviolet (UV) light, the UV light passes through the window 131 and through the backside of the target wafer 108 such that the target alignment mark 124 is viewable through the window 131 and viewable through the target wafer 108.

Figure 2:
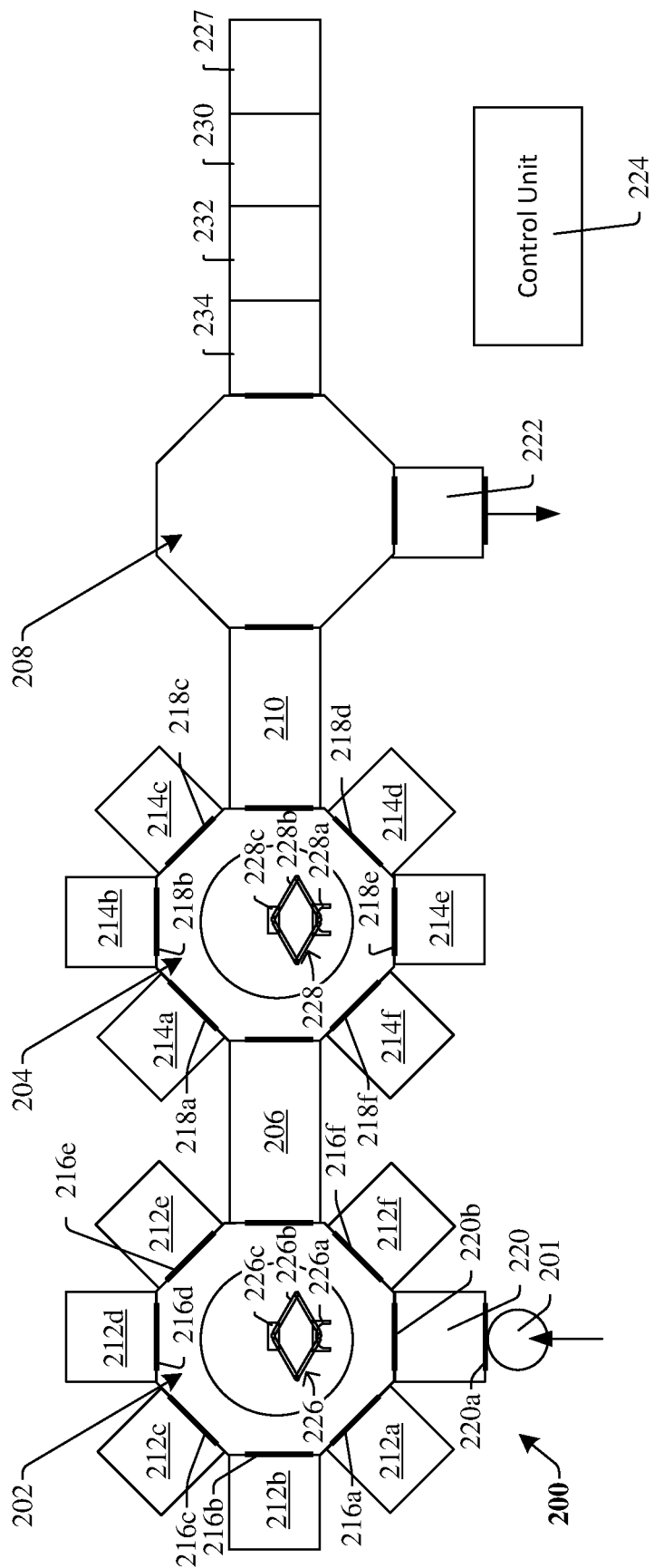
FIG. 2 shows a schematic view of some embodiments of a cluster tool that is suited for manufacturing OLED devices with high accuracy patterning.

In some embodiments, the processing tool 100 of FIG. 1A or FIG. 1B can be implemented as part of a cluster tool, such as shown in FIG. 2. The cluster tool 200 comprises a first transfer chamber 202 and a second transfer chamber 204, which are generally used to build up an array of OLEDs on a target wafer. The first and second transfer chambers 202, 204 are connected through a first connector chamber 206. An encapsulation chamber 208 is downstream of the second transfer chamber 204, and is configured to adhere a glass cover to the target wafer with the OLEDs thereon, and thereby output a wafer corresponding to an OLED display. A second connector chamber 210 connects the second transfer chamber 204 to the encapsulation chamber 208.

A number of first processing chambers 212a, 212b, 212c, 212d, 212e are arranged about the first transfer chamber 202, and a number of second processing chambers 214a, 214b, 214c, 214d, 214e are arranged about the second transfer chamber 204. The first processing chambers 212a-212e may have portals or seals 216a-216e, respectively, which allow the respective processing chambers to perform independent processing steps; and the second processing chambers may also have portals or seals 218a-218e, respectively, which allow the second processing chambers 214a-214e to perform independent cleaning steps. An entry load lock 220, an exit load lock 222, and designated mask storage chambers 212f, 214f are also present.

During operation of the cluster tool 200, a control unit 224 is configured to control first and second transfer robots 226 and 228 (which includes a wafer grippers 226a,228a and accordion-style arms 226b, 228b that extend and retract from rotatable bases 226c, 228c, respectively) the various portals; the various processing chambers; and vacuum pumps for the various chambers according to the following sequence. The control unit 224 can include a memory and a microprocessor, as well as servos, actuators, and the like to facilitate the operation described below. Further, transfer chambers 202, 204, connector chambers 206, 210, encapsulation chamber 208, and processing chambers 212a-212f, and 214a-214f are typically retained under continuous vacuum during the operation described below. In other embodiments, the ordering of this sequence can vary, for example, some steps can be re-ordered from what is illustrated and described; and/or these and/or other steps can be omitted; while still other steps can be inserted. Further, the locations and numbers of the processing chambers 212a-212e and 214a-214e as well as storage chambers 212f, 214f can be rearranged and/or altered in other embodiments.

A glass entry load lock 227 is configured to receive a glass cover or other transparent cover, while a glass cleaning station 230 is configured to apply ultraviolet (UV) light to the glass cover to clean the glass cover. Glue can then be applied to one face of the glass cover in a glue application module 232, and the glass cover can then be applied to the target wafer. The glue can be dried at a drying station 234 for example by using a heater, after which the target wafer with the OLED and glass cover can then be transferred through the exit load lock 222.

Figure 3:
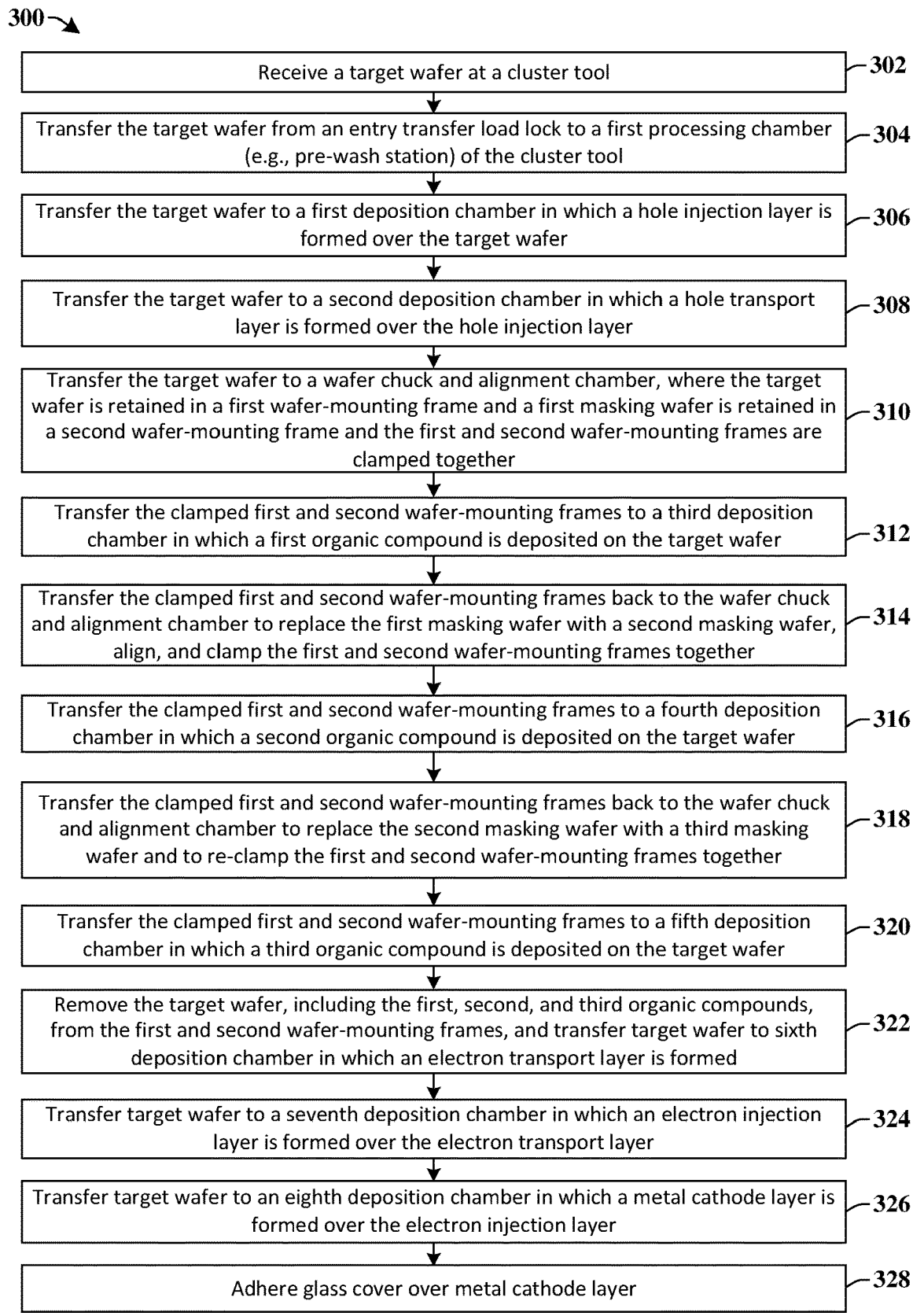
FIG. 3 shows a flow diagram of a method of using a cluster tool to manufacture OLED devices in accordance with some embodiments.

FIG. 3 shows a more detailed flow diagram of a method 300 of performing a deposition with high accuracy pattern in accordance with some embodiments. The method 300 will be discussed with respect to the FIG. 2's cluster tool 200 and with respect to FIGS. 5-19, which show a series of schematic views of a processing tool in different steps of wafer processing. Although FIG. 2 and FIGS. 5-19 are described in relation to method 300, it will be appreciated that the structures disclosed in FIG. 2 and FIGS. 5-19 are not limited to such a method 300, but instead may stand alone as structures independent of the method. Similarly, although the method 300 is described in relation to FIG. 2 and FIGS. 5-19, it will be appreciated that the method is not limited to the structures disclosed in FIGS. 5-19, but instead may stand alone independent of the structures disclosed in FIG. 2 and FIGS. 5-19. Although the flow diagram and schematic views describe the cluster tool in the context of a cluster tool, it will be appreciated that this cluster tool, which includes a number of epitaxial deposition chambers, is a non-limiting example and other types of cluster tools and/or processing chambers, such as other deposition tools or etching tools, are contemplated as falling within the scope of this disclosure.

At action 302, a target wafer (e.g., 108 FIG. 1A), which includes an anode layer formed on a substrate, is received at a cluster tool (e.g., cluster tool 200 of FIG. 2). In some embodiments, the target wafer can take the form of a disc-like wafer having a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); or 450 mm (17.7 inch, usually referred to as "18 inch"); for example. Further, in some embodiments, the target wafer can be made of monocrystalline silicon, but in other embodiments, the target wafer can be made of glass, sapphire, or another suitable material. In some embodiments, the anode layer comprises indium tin oxide (ITO).

At the onset of operation, a wafer carrier, such as a front opening unified pod (FOUP) which includes a lot of wafers including the target wafer, is placed on a loading port (e.g., FIG. 2, 201) of the cluster tool. With the target wafer on the loading port (e.g., FIG. 2, 201), an outer load lock portal (e.g., FIG. 2, 220a) of an entry load lock is opened while an inner load lock portal (e.g., FIG. 2, 220b) of the entry load lock remains closed to retain vacuum for the inner chambers of cluster tool. The wafer carrier is opened on the loading port and the target wafer is exposed to ambient fab environment, and then the target wafer is moved through outer load lock portal (e.g., FIG. 2, 220a) and into entry load lock (e.g., FIG. 2, 220) and, the outer load lock portal (e.g., FIG. 2, 220a) is then closed. The entry load lock (e.g., FIG. 2, 220) is then pumped down to vacuum, and the inner load lock portal (e.g., FIG. 2, 220b) is then opened.

At action 304, the target wafer is transferred from the entry load lock (e.g., 220 in FIG. 2) to a first processing chamber (e.g., 212a in FIG. 2). This can be carried out by a first transfer robot (e.g., 226 in FIG. 2). The first processing chamber 212a in this example corresponds to a pre-wash station in which the target wafer is washed. For example, the target wafer can be washed or rinsed with deionized water, acetone, surfactant; and/or another cleaning process can be used to clean the surface of the target wafer. The washing can also include a photoresist strip process, such as a plasma stripping process, for example.

At action 306, the first transfer robot (e.g., FIG. 2, 226) transfers the target wafer to a first deposition chamber (e.g., FIG. 2, 212b) in which a hole injection layer is formed over the anode layer. After the target wafer is placed in the first deposition chamber (e.g., FIG. 2, 212b) the first chamber portal (e.g., FIG. 2, 216b) can be closed, and the deposition process can be performed to form the hole injection layer on the target wafer. After processing, the first chamber portal (e.g., FIG. 2, 216b) is re-opened, and the first transfer robot transfers the target wafer back out of the first chamber portal. Other processing chambers are typically operated in a similar manner for the processing operations described herein, with their respective portals opened, the target wafer inserted and portals closed, processing carried out, then the respective portals reopened and the target wafer removed when processing is complete in that processing chamber.

At action 308, the first transfer robot (e.g., FIG. 2, 226) transfers the target wafer from the first deposition chamber (e.g., FIG. 2, 212b) to a second deposition chamber (e.g., FIG. 2, 212c) in which a hole transport layer is formed over the hole injection layer.

Figure 4:
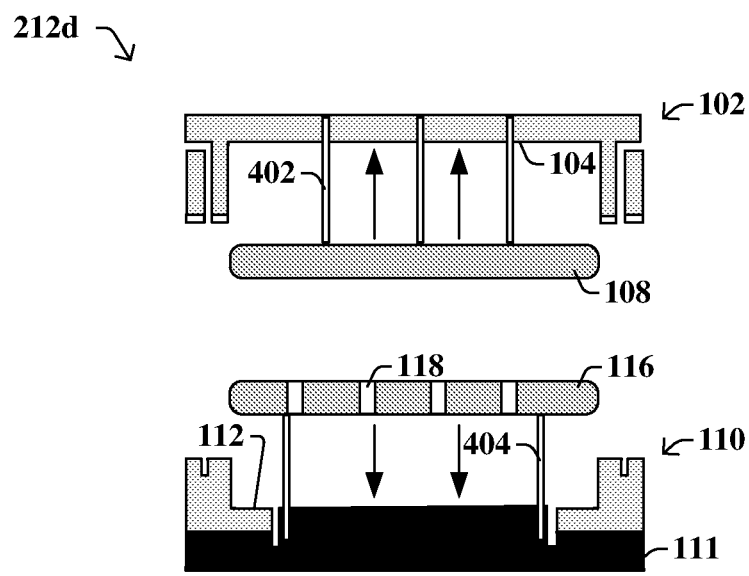
FIGS. 4-19 show a series of schematic views of a processing tool in different steps of wafer processing illustrating methods of using a cluster tool to manufacture OLED devices in accordance with some embodiments.

At action 310, the first transfer robot (e.g., FIG. 2, 226) transfers the target wafer from the second deposition chamber (e.g., FIG. 2, 212c) to a wafer chuck and alignment chamber (e.g., FIG. 2, 212d). The first transfer robot (e.g., FIG. 2, 226) also loads a first masking wafer 116 from a first mask storage chamber (e.g., FIG. 2, 212O to the wafer chuck and alignment chamber (e.g., FIG. 2, 212d). FIG. 4 shows a more detailed example of the wafer chuck and alignment chamber 212d, where the target wafer 108 is retained in a first wafer-mounting frame 102. In some embodiments, a series of pins 402 may extend through an engagement surface 104 of the first wafer-mounting frame 102 to engage the target wafer 108. The pins 402 may use suction to engage the backside of the target wafer 108, and then may retract to bring the backside of the target wafer 108 flush with the engagement surface 104. The first masking wafer 116 is retained in a second wafer-mounting frame 110 that rests on a base pedestal 111. The first masking wafer 116 includes a number of openings 118 that define a first predetermined deposition pattern. In some embodiments, a series of pins 404 may extend through the ledge of the second engagement face 112 of the second wafer-mounting frame 110 and/or base pedestal 111 to engage the first masking wafer 116. The pins 404 may use suction to engage the backside of the first masking wafer 116, and then may retract to bring the backside of the first masking wafer 116 flush with the ledge of the second engagement face 112. In some embodiments, target wafer 108 is a first semiconductor wafer having a first outer diameter, and the first masking wafer 116 is a second semiconductor wafer having a second outer diameter equal to the first outer diameter. Although the first masking wafer 116 could also be made out of stainless steel or other materials, there are some efficiencies by using semiconductor material for the first masking wafer because as residue builds up on the first masking wafer during use, processing techniques that are compatible with the semiconductor material are already employed in other areas of the cluster tool and/or fab, and thus this streamlines processing in some regards.

Figure 5:
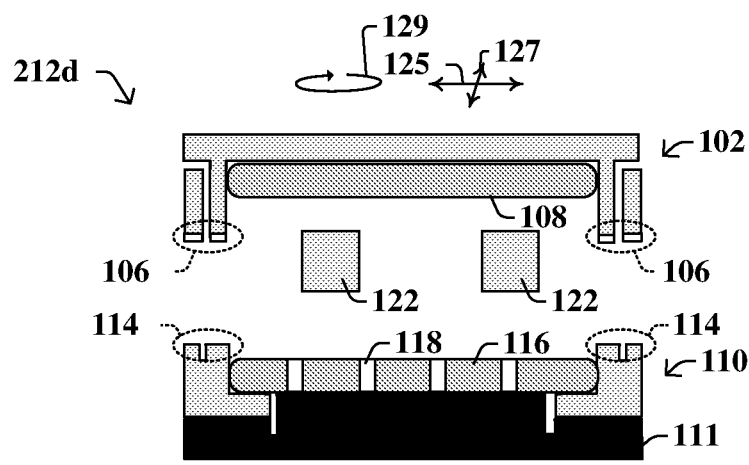

As illustrated in FIG. 5, the target wafer 108 and the first masking wafer 116 are then aligned to one another in the wafer chuck and alignment chamber (e.g., FIG. 2, 212d). In some embodiments, one or more imaging devices 122 such as cameras or charge-coupled devices (CCDs) may be inserted by a robotic arm between the target wafer 108 and the masking wafer 116 to image a target alignment mark on the target wafer and a first alignment mark on the first masking wafer. In other embodiments, the engagement surface of the first wafer-mounting frame may include a window, such as a glass window that allows viewing of a target alignment mark on the target wafer 108. For example, the target alignment mark may be made of a metal, such as chrome, nickel, titanium, or aluminum and can be on the frontside of the target wafer. In cases where the viewing is done with ultraviolet (UV) light, the UV light passes through the window and through the target wafer such that the target alignment mark is viewable through the window and viewable through the target wafer. Then, at least one of the target wafer 108 and the first masking wafer 116 is moved, for example in an x-direction 125 in a plane parallel to the target wafer and/or masking wafer, y-direction 127 in the plane, and/or through an angular rotation 129 in the plane. This movement reduces the amount of misalignment, thereby aligning the first masking wafer 116 and the target wafer 108.

Figure 6:
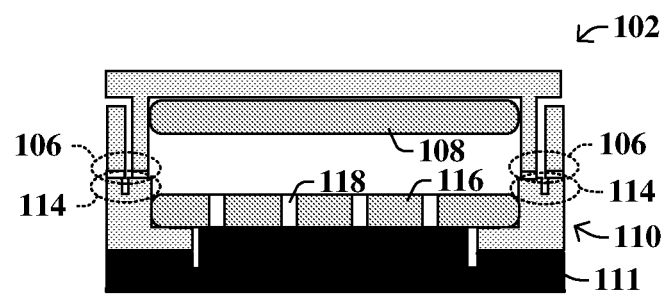

Once the target wafer is aligned with the first masking wafer, the first and second wafer-mounting frames 102, 110, which retain the target wafer 108 and first masking wafer 116, are clamped together, for example as shown in FIG. 6. Thus, a first coupling assembly 106 on the first wafer-mounting frame is coupled to a second coupling assembly 114 on the second wafer-mounting frame to provide this clamping.

Figure 7:
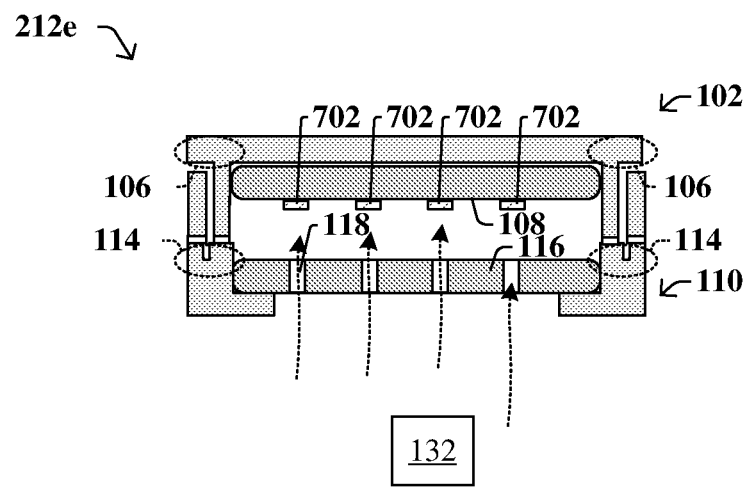

Referring back to FIG. 3, at action 312, the first transfer robot (e.g., FIG. 2, 226) then picks up the clamped first and second wafer-mounting frames from the base pedestal 111 in the wafer chuck and alignment chamber (e.g., FIG. 2, 212d), and transfers the clamped first and second wafer-mounting frames to a third deposition chamber (e.g., FIG. 2, 212e). As illustrated in FIG. 7, in the third deposition chamber 212e a first emissive material is generated by a first organic deposition source 132 in the third deposition chamber, and is passed through the openings 118 in the first masking wafer 116 to form the first emissive material according to the first predetermined deposition pattern. The first predetermined deposition pattern can correspond to subpixels corresponding to region of the first emissive material 702 (e.g., blue subpixels) that are now formed on the target wafer 108. When a current is passed through the first emissive material, the first emissive material can emit light of a first wavelength (e.g., blue light).

Figure 8:
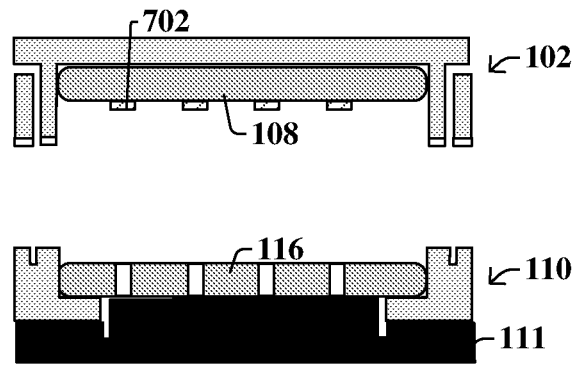
Figure 9:
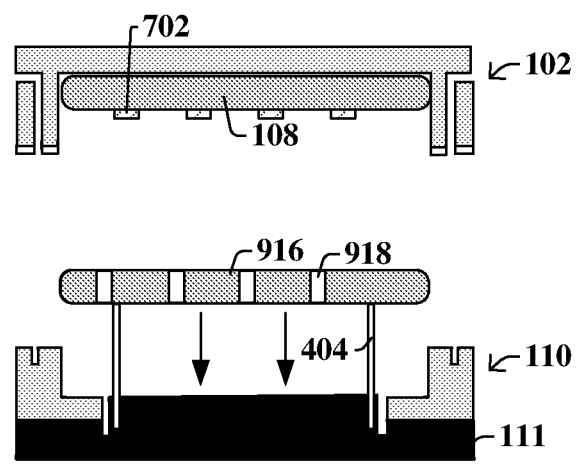

Referring back to FIG. 3, at action 314, the first transfer robot (e.g., FIG. 2, 226) then transfers the clamped first and second wafer-mounting frames from the third deposition chamber (e.g., FIG. 2, 212e) back to the wafer chuck and alignment chamber (e.g., FIG. 2, 212d). As illustrated in FIG. 8, the first and second wafer-mounting frames are un-clamped in the wafer chuck and alignment chamber (e.g., FIG. 2, 212d) by decoupling the first and second coupling assemblies. The first masking wafer 116 is then removed from the second wafer-mounting frame 110. A second masking wafer 916 is then picked up from the first mask storage chamber (e.g., FIG. 2, 212O and, as shown in FIG. 9, the second masking wafer 916 is retained in the second wafer-mounting frame 110. The second masking wafer 916 includes a second predetermined pattern of openings 918 corresponding to a second predetermined deposition pattern by which a second emissive material is to be formed on the target wafer 108.

Figure 10:
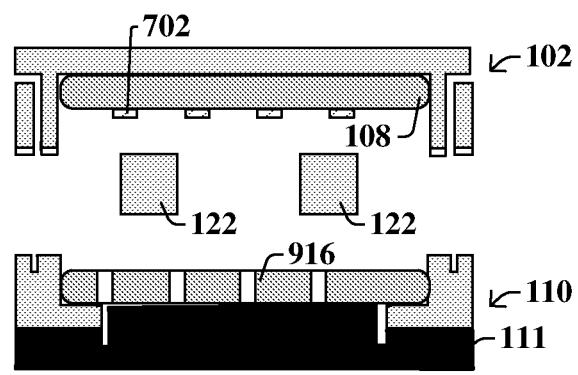
Figure 11:
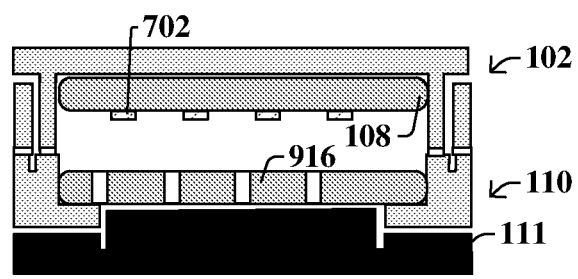

As illustrated in FIG. 10, the target wafer 108 and the second masking wafer 916 are than aligned to one another, and the first and second wafer-mounting frames 102, 110, which retain the target wafer and second masking wafer, are clamped together, as illustrated in FIG. 11.

Figure 12:
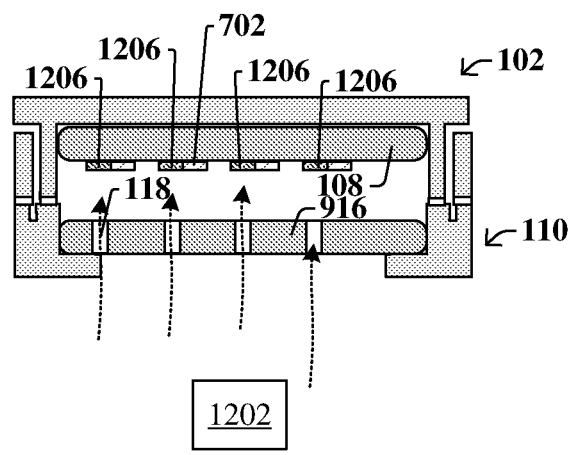

At action 316, the first transfer robot (e.g., FIG. 2, 226) then transfers the clamped first and second wafer-mounting frames from the wafer chuck and alignment chamber (e.g., FIG. 2, 212d) through the first connector chamber 206 to the second transfer robot 228. The second transfer robot 228 then transfers the clamped first and second wafer-mounting frames to a fourth deposition chamber (e.g., FIG. 2, 214a). As illustrated in FIG. 12, in the fourth deposition chamber (e.g., FIG. 2, 214a), a second emissive material is generated by a second organic deposition source 1202 in the fourth deposition chamber, and is passed through the openings 918 in the second masking wafer 916 to form the second emissive material 1206 according to the second predetermined deposition pattern. The second predetermined deposition pattern can correspond to subpixels corresponding to region of the second emissive material 1206 (e.g., red subpixels) that are now formed on the target wafer 108. When a current is passed through the second emissive material, the second emissive material can emit light of a second wavelength (e.g., red light).

Figure 13:
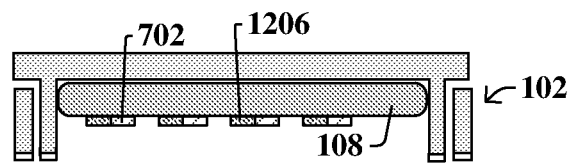
Figure 13:
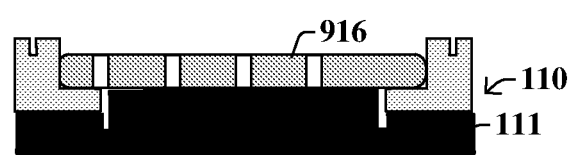
Figure 14:
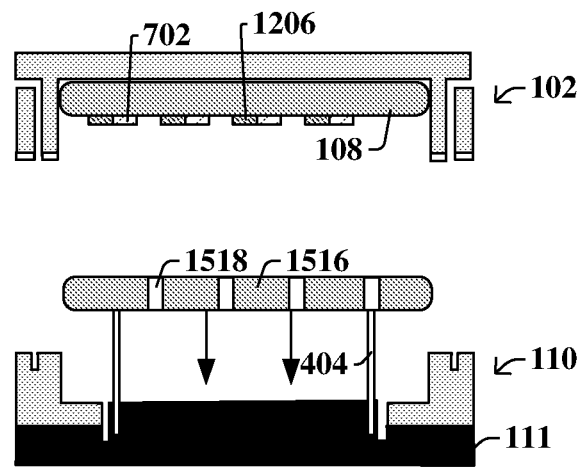
Figure 15:
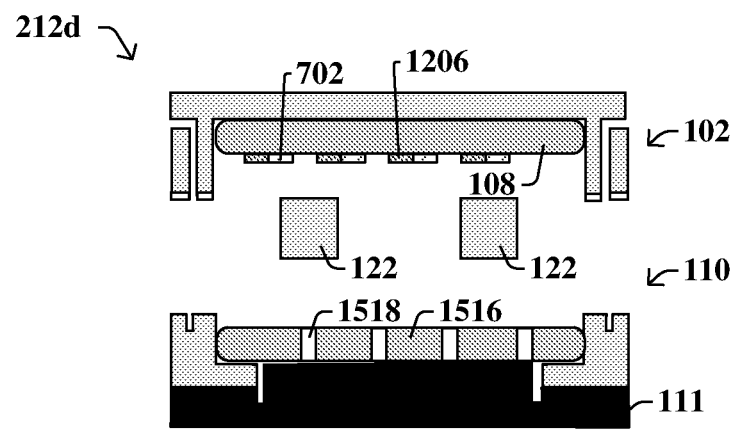
Figure 16:
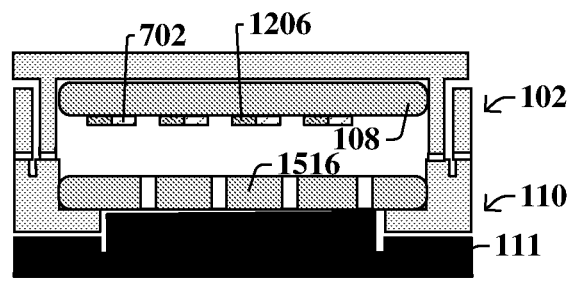

At action 318, the second transfer robot (e.g., FIG. 2, 228) then transfers the target wafer back through the first connector chamber (e.g., FIG. 2, 206) to the first transfer robot (e.g., FIG. 2, 226), which then transfers the clamped first and second wafer-mounting frames back to the wafer chuck and alignment chamber (e.g., FIG. 2, 212*d*), where the first and second wafer-mounting frames are un-clamped (see FIG. 13). The second masking wafer is then removed from the second wafer-mounting frame. A third masking wafer 1516 is picked up from the mask storage chamber (e.g., FIG. 2, 2120 and, as shown in FIG. 14, is retained in the second wafer-mounting frame 110. The third masking wafer 1516 includes a third predetermined pattern of openings 1518 corresponding to a third predetermined deposition pattern by which a third emissive material is to be formed on the target wafer 108. The target wafer and the third masking wafer are than aligned to one another (see FIG. 15), and the first and second wafer-mounting frames, which retain the target wafer and third masking wafer, are clamped together (see FIG. 16**).

Figure 17:
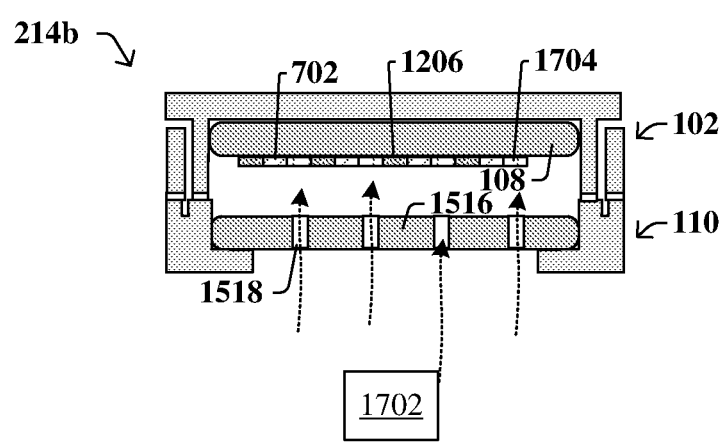

At action 320, the first transfer robot then transfers the clamped first and second wafer-mounting frames from the wafer chuck and alignment chamber (e.g., FIG. 2, 212*d*) through the first connector chamber (e.g., FIG. 2, 206) to the second transfer robot (e.g., FIG. 2, 228). The second transfer robot then transfers the clamped first and second wafer-mounting frames to a fifth deposition chamber (e.g., FIG. 2, 214*b*). As illustrated in FIG. 17, in the fifth deposition chamber (e.g., FIG. 2, 214*b*), a third emissive material is generated by a third organic deposition source 1702 in the fifth deposition chamber, and is passed through the openings 1518 in the third masking wafer 1516 to form the third emissive material 1704 according to the third predetermined deposition pattern. The third predetermined deposition pattern can correspond to subpixels corresponding to region of the third emissive material 1704 (e.g., green subpixels) that are now formed on the target wafer 108**. When a current is passed through the third emissive material, the third emissive material can emit light of a third wavelength (e.g., green light).

Figure 18:
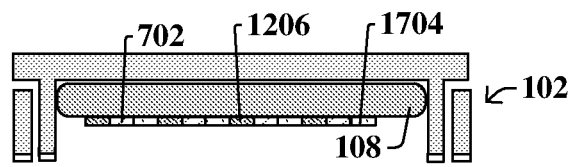
Figure 18:
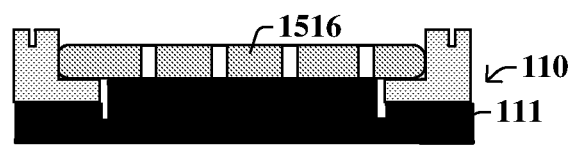
Figure 19:
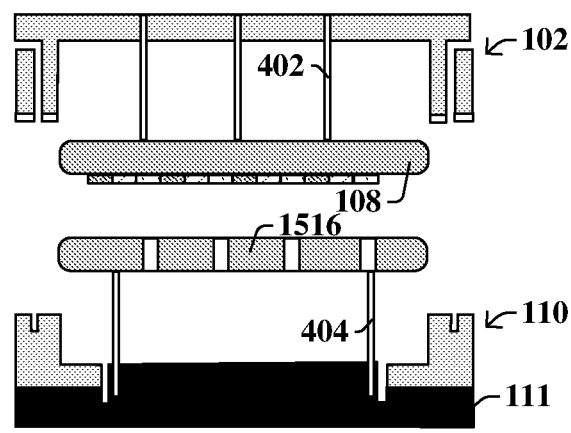

At action 322, the second transfer robot then transfers the clamped first and second wafer-mounting frames, which retain the target wafer and the third masking wafer, back through the first connector chamber (e.g., FIG. 2, 206) to the first transfer robot (e.g. FIG. 2, 226), which then transfers the clamped first and second wafer-mounting frames back to the wafer chuck and alignment chamber (e.g. FIG. 2, 212*d*), where the first and second wafer-mounting frames are un-clamped (see FIG. 18). The target wafer is then removed from the first wafer-mounting frame, for example by pins extending through the engagement surface of the first wafer-mounting frame (see FIG. 19) and the third masking wafer 1516 is removed from the second wafer-mounting frame. The third masking wafer is returned to the mask storage chamber (e.g., FIG. 2, 2120 by the first transfer robot (e.g., FIG. 2, 226). The target wafer is transferred by the first transfer robot (e.g., FIG. 2, 226) though the first connection chamber (e.g., FIG. 2, 226) to a second transfer robot (e.g., FIG. 2, 228), which then transfers the target wafer to a sixth deposition chamber (e.g., FIG. 2, 214*c*), in which an electron transport layer is formed over the first, second, and third emissive materials.

At action 324, the second transfer robot (e.g., FIG. 2, 228) transfers target wafer from the sixth deposition chamber (e.g., FIG. 2, 214*c*) to a seventh deposition chamber (e.g., FIG. 2, 212*d*) in which an electron injection layer is formed over the electron transport layer.

At action 326, the second transfer robot transfers the target wafer from the seventh deposition chamber (e.g., FIG. 2, 212*d*) to an eighth deposition chamber (e.g., FIG. 2, 212*e*) in which a metal cathode layer is formed over the electron injection layer.

At action 328, a glass cover is adhered over the metal cathode layer. For example, in FIG. 2, a glass cover can be loaded into a glass entry load lock (e.g., FIG. 2, 228), then cleaned by applying ultraviolet (UV) light to the glass cover (e.g., FIG. 2, 230). At FIG. 2, 232, glue can then be applied to one face of the glass cover and used to attach the glass cover to the wafer; the glue can be dried for example by using a heater at 234. The wafer with OLED and glass cover can then be transferred through the exit load lock 222.

Figure 20:
FIG. 20 shows a cross-sectional view of an OLED device manufactured by a processing tool according to some embodiments.
Figure 21:
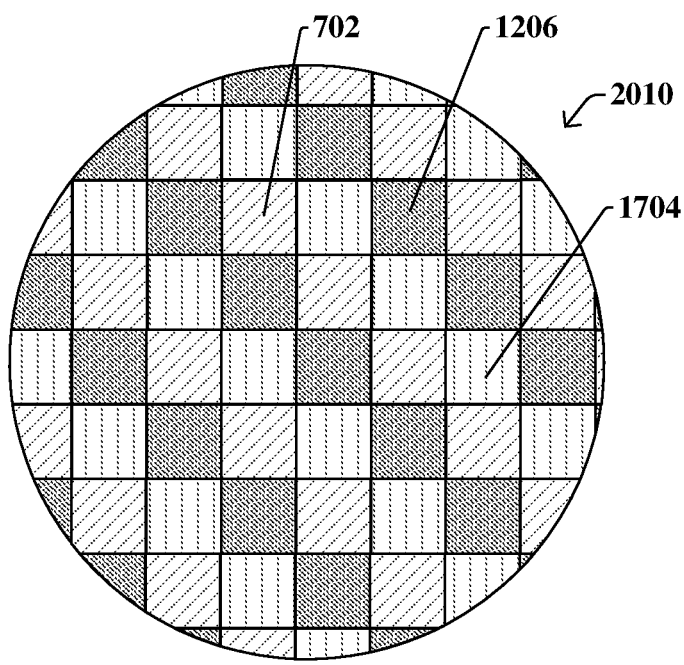
FIG. 21 shows a top view of an emissive layer of an OLED in accordance with some embodiments.

FIG. 20 shows a cross-sectional view of some embodiments of an OLED device that includes an emissive layer made of multiple different organic materials arranged according to predetermined deposition patterns. The OLED device includes a substrate 2002 that can be made of monocrystalline silicon, glass, sapphire, or another suitable material. An anode layer 2004, such as a TIO anode, is disposed over the substrate 2002. A hole injection layer 2006 is disposed over the anode layer 2004, and a hole transport layer 2008 is disposed over the hole injection layer 2006. An emissive layer 2010 made of various different emissive materials at the same height over the substrate 2002 is disposed over the hole transport layer 2008. Briefly referring to FIG. 21, one can see from an example top view of the emissive layer 2010 that the emissive layer 2010 includes a first emissive material 702, a second emissive material 1206, and a third emissive material 1704 that are arranged according to respective patterns to establish an OLED pixel array. As shown in some embodiments, the regions of first emissive material 702 have edges that abut corresponding edges of the second emissive material 1206 and third emissive material 1704. The regions of the first emissive material 702, second emissive material 1206, and third emissive material 1704 are shown as squares in FIG. 21, but can also be rectangles or other polygonal shapes, or can be circles, ovals, or other rounded shapes. The first emissive material 702 can correspond to a first organic compound that can generate blue light. The second emissive material 1206 can correspond to a second organic compound that can generate red light. The third emissive material 1704 can correspond to a third organic compound that can generate green light. Referring back to FIG. 20, an electron transport layer 2012 is disposed over the emissive layer, and an electron injection layer 2014 is disposed over the electron transport layer. A cathode 2016 is disposed over the electron injection layer 2014, and a glass cover 2018 or other transparent cover is disposed over the cathode 2016.

In some embodiments, the present disclosure relates to a processing tool. The tool includes a first wafer-mounting frame including a first engagement face and a first coupling assembly. The first engagement face is configured to retain a target wafer. A second wafer-mounting frame includes a second engagement face and a second coupling assembly configured to engage the first coupling assembly to couple the first wafer-mounting frame to the second wafer-mounting frame. The second wafer-mounting frame is configured to retain a masking wafer on the second engagement face. The masking wafer includes a mask pattern made up of a number of openings passing through the masking wafer to correspond to a predetermined deposition pattern to be formed on the target wafer. A deposition chamber is configured to receive the first and second wafer-mounting frames when the first and second coupling assemblies are engaged to retain the target wafer and the masking wafer. The deposition chamber includes a material deposition source configured to deposit material from the material deposition source through the number of openings in the mask pattern to form the material in the predetermined deposition pattern on the target wafer.

In other embodiments, the present disclosure relates to a method for processing wafers. In the method a target wafer is retained on a first wafer-mounting frame, and a first masking wafer is retained on a second wafer-mounting frame. The first masking wafer includes a first mask pattern made up of a first number of openings passing through the first masking wafer. The first mask pattern corresponds to a first predetermined deposition pattern to be formed on the target wafer. A first amount of misalignment is determined between a target alignment mark on the target wafer and a first alignment mark on the first masking wafer. At least one of the target wafer and the first masking wafer is/are moved to reduce the first amount of misalignment, thereby aligning the first masking wafer and the target wafer. The first wafer-mounting frame is clamped to the second wafer-mounting frame after the first masking wafer and the target wafer have been aligned. The clamped first and second wafer-mounting frames, which include the aligned target wafer and the first masking wafer, are arranged before a first deposition source. First material is provided from the first deposition source through the first number of openings on the first masking wafer to form the first material according to the first predetermined deposition pattern on the target wafer.

In yet other embodiments, the present disclosure relates to a method for processing wafers in a cluster tool. In the method a target wafer including an anode layer is transferred from a transfer load lock to a first processing chamber through a first transfer chamber using a first transfer robot. In the first processing chamber, a hole injection layer is formed over the anode layer. The target wafer including the hole injection layer is transferred from the first processing chamber to a second processing chamber using the first transfer robot. In the second processing chamber, a hole transport layer is formed over the hole injection layer. The target wafer including the hole transport layer is retained on a first wafer-mounting frame, and a first masking wafer is retained on a second wafer-mounting frame. The first masking wafer includes a first mask pattern made up of a first number of openings passing through the first masking wafer. The first mask pattern corresponds to a first predetermined deposition pattern to be formed on the target wafer. A first amount of misalignment is determined between a target alignment mark on the target wafer and a first alignment mark on the first masking wafer. At least one of the first masking wafer and the target wafer is/are moved to reduce the first amount of misalignment, thereby aligning the first masking wafer and the target wafer. The first wafer-mounting frame is clamped to the second wafer-mounting frame after the first masking wafer and the target wafer have been aligned. The clamped first and second wafer-mounting frames, which include the aligned first masking wafer and the target wafer therein, are arranged in a third processing chamber. A first emissive material is deposited through the first number of openings on the first masking wafer to form the first emissive material according to the first predetermined deposition pattern on the target wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A processing tool comprising:
a first wafer-mounting frame configured to retain a target wafer;
a second wafer-mounting frame configured to retain a masking wafer, the first and second wafer-mounting frames configured to be clamped together; and
an imaging device arranged between the first wafer-mounting frame and the second wafer-mounting frame, the imaging device configured to measure an amount of misalignment between the target wafer and the masking wafer when the target wafer is retained by the first wafer-mounting frame and the masking wafer is retained by the second wafer-mounting frame.

2. The processing tool of claim 1, a deposition chamber configured to receive the first and second wafer-mounting frames when the first and second wafer-mounting frames are clamped together, the deposition chamber including a deposition source configured to deposit a material on the target wafer through a plurality of openings in the masking wafer.

3. The processing tool of claim 1, wherein the first wafer-mounting frame includes a first engagement face and a first coupling assembly, the first engagement face configured to retain the target wafer, and wherein the second wafer-mounting frame includes a second engagement face and a second coupling assembly, the second engagement face configured to retain the masking wafer, the first and second coupling assemblies configured to engage one another to clamp the first and second wafer-mounting frames together.

4. The processing tool of claim 3, wherein the first wafer-mounting frame includes a first retaining ring protruding from the first engagement face and laterally surrounding the first engagement face, and wherein the second wafer-mounting frame includes a second retaining ring protruding from the second engagement face and laterally surrounding the second engagement face.

5. The processing tool of claim 1, further comprising:
a robotic assembly configured to insert the imaging device between the first and second wafer-mounting frames.

6. The processing tool of claim 1, wherein the imaging device is configured to image a target alignment mark on the target wafer to determine a position of the target alignment mark and to image a masking alignment mark on the masking wafer to determine a position the masking alignment mark.

7. The processing tool of claim 6, further comprising:
an alignment assembly configured to move at least one of the target wafer and the masking wafer to align the target alignment mark and the masking alignment mark.

8. The processing tool of claim 1, wherein the imaging device is configured to measure the amount of misalignment before the first and second wafer-mounting frames are clamped together.

9. A processing tool comprising:
a first wafer-mounting frame including a first engagement face and a first coupling assembly, wherein the first engagement face is configured to retain a target wafer;
a second wafer-mounting frame including a second engagement face and a second coupling assembly configured to engage the first coupling assembly to couple the first wafer-mounting frame to the second wafer-mounting frame, the second wafer-mounting frame configured to retain a masking wafer on the second engagement face, wherein the masking wafer includes a mask pattern made up of a number of openings passing through the masking wafer to correspond to a predetermined deposition pattern to be formed on the target wafer;
a deposition chamber configured to receive the first and second wafer-mounting frames when the first and second coupling assemblies are engaged to retain the target wafer and the masking wafer, the deposition chamber including a material deposition source configured to deposit material from the material deposition source through the number of openings in the mask pattern to form the material in the predetermined deposition pattern on the target wafer; and
a robotic assembly configured to arrange an imaging device between the target wafer and the masking wafer, the imaging device configured to image a target alignment mark on the target wafer and a masking alignment mark on the masking wafer.

10. The processing tool of claim 9, further comprising:
the imaging device, wherein the robotic assembly is configured to arrange the imaging device between the first wafer-mounting frame and the second wafer-mounting frame.

11. The processing tool of claim 9, further comprising:
an alignment assembly configured to move at least one wafer of the masking wafer and the target wafer along a first linear axis along a face of the at least one wafer, to move the at least one wafer along a second linear axis along the face of the at least one wafer and perpendicular to the first linear axis, and/or to move the at least one wafer through a rotation on the face of the at least one wafer to align the target alignment mark with the masking alignment mark.

12. The processing tool of claim 9:
wherein the first wafer-mounting frame includes a first retaining ring extending from the first engagement face to laterally surround the target wafer; and
wherein the second wafer-mounting frame includes a second retaining ring extending from the second engagement face to laterally surround the masking wafer.

13. The processing tool of claim 12, wherein the first coupling assembly is arranged on the first retaining ring.

14. The processing tool of claim 12, wherein the second coupling assembly is arranged on the second retaining ring.

15. The processing tool of claim 10, wherein the target wafer is a first semiconductor wafer having a first outer diameter, and the masking wafer is a second semiconductor wafer having a second outer diameter equal to the first outer diameter.

16. A processing tool comprising:
a first wafer-mounting frame configured to retain a target wafer;
a second wafer-mounting frame configured to retain a masking wafer, the first and second wafer-mounting frames configured to be clamped together;
an imaging device configured to measure an amount of misalignment between the target wafer and the masking wafer when the target wafer is retained by the first wafer-mounting frame and the masking wafer is retained by the second wafer-mounting frame;
a robotic assembly configured to position the imaging device between the first and second wafer-mounting frames; and
a deposition chamber including a deposition source configured to deposit a material on the target wafer through a plurality of openings in the masking wafer when the target wafer is retained by the first wafer-mounting frame, when the masking wafer is retained by the second wafer-mounting frame, and when the first and second wafer-mounting frames are clamped together.

17. The processing tool of claim 16, wherein the first wafer-mounting frame includes a first engagement face configured to retain the target wafer, a first retaining ring protruding from the first engagement face and laterally surrounding the first engagement face, and a first coupling assembly arranged on the first retaining ring,
wherein the second wafer-mounting frame includes second engagement face configured to retain the masking wafer, a second retaining ring protruding from the second engagement face and laterally surrounding the second engagement face, and a second coupling assembly arranged on the second retaining ring, and
wherein the first and second coupling assemblies are configured to be coupled together to clamp the first and second wafer-mounting frames together.

18. The processing tool of claim 16, further comprising:
an alignment assembly configured to move the masking wafer and/or the target wafer to reduce the amount of misalignment between the target wafer and the masking wafer.

19. The processing tool of claim 9, wherein the imaging device is configured to image the target alignment mark and the masking alignment mark while the imaging device is arranged between the target wafer and the masking wafer by the robotic assembly.

20. The processing tool of claim 10, wherein the imaging device includes a first camera and a second camera spaced from the first camera, and wherein the robotic assembly is configured to arrange the first camera and the second camera between the target wafer and the masking wafer.

* * * * *